(12) United States Patent
Winningham et al.

(10) Patent No.: US 6,518,194 B2
(45) Date of Patent: Feb. 11, 2003

(54) INTERMEDIATE TRANSFER LAYERS FOR NANOSCALE PATTERN TRANSFER AND NANOSTRUCTURE FORMATION

(76) Inventors: Thomas Andrew Winningham, 2809 Decatur Dr., Broomfield, CO (US) 80020; Kenneth Douglas, 365 21st St., Boulder, CO (US) 80302

( * ) Notice: Subject to any disclaimer, the term of this patent is extended or adjusted under 35 U.S.C. 154(b) by 26 days.

(21) Appl. No.: 09/750,522

(22) Filed: Dec. 28, 2000

(65) Prior Publication Data

US 2002/0123227 A1 Sep. 5, 2002

(51) Int. Cl.$^7$ .................. H01L 21/302; H01L 21/461
(52) U.S. Cl. .................. 438/717; 438/1; 438/700; 438/736; 438/738; 438/742; 438/743; 438/744; 438/942; 438/945; 438/947; 216/17; 216/39; 216/49; 216/51; 216/54
(58) Field of Search .................. 438/700, 1, 717, 438/736, 738, 742, 743, 744, 942, 945, 947; 216/17, 39, 49, 51, 54

(56) References Cited

U.S. PATENT DOCUMENTS

| | | |
|---|---|---|
| 4,728,591 A | 3/1988 | Clark et al. |
| 4,802,951 A | 2/1989 | Clark et al. |
| 5,229,320 A | 7/1993 | Ugajin |
| 5,559,822 A | 9/1996 | Pankove et al. |
| 5,609,907 A | 3/1997 | Natan |
| 5,683,595 A | 11/1997 | Nagamachi |
| 5,703,896 A | 12/1997 | Pankove et al. |
| 5,858,457 A | 1/1999 | Brinker et al. |
| 5,899,734 A | 5/1999 | Lee |
| 5,948,470 A * | 9/1999 | Harrison et al. ............ 427/198 |
| 6,350,388 B1 * | 2/2002 | Knappenberger et al. ..... 216/42 |

OTHER PUBLICATIONS

Douglas et al., "Transfer of Biologically Derived Nanometer–Scale Patterns to Smooth Substrates", Science, vol. 257, Jul. 31, 1992, pp. 642–644.*
Geis et al., "Self–developing resist with submicrometer resolution and processing stability", Appl. Phys. Lett, vol. 43, No. 1, Jul. 1983, pp. 74–76.*
U.S. patent application Ser. No. 09/583,209, Winningham et al., filed May 30, 2000.
U.S. patent application Ser. No. 09/642,135, Winningham et al., filed Aug. 18, 2000.
Arkles, Barry, "Silane Coupling Agent Chemistry" in *Silicon Compounds: Register and Review*, 5$^{th}$ Ed., United Chemical Technologies, Inc., Bristol, PA, pp. 59–64.
Bhatia, Suresh K. et al., "Fabrication of Surfaces Resistant to Protein Adsorption and Application to Two–Dimensional Protein Patterning," *Analytical Biochemistry*, vol. 208, 1993, pp. 197–205.

(List continued on next page.)

*Primary Examiner*—David L. Talbott
*Assistant Examiner*—David A. Zarneke
(74) *Attorney, Agent, or Firm*—Marion J. Furst (57) ABSTRACT

A method for using intermediate transfer layers for transferring nanoscale patterns to substrates and forming nanostructures on substrates. An intermediate transfer layer is applied to a substrate surface, and one or more mask templates are then applied to the intermediate transfer layer. Holes are etched through the intermediate transfer layer, and material may be deposited into the etched holes.

22 Claims, 6 Drawing Sheets

OTHER PUBLICATIONS

Deatherage, J.F. et al., "Three–dimensional Arrangement of the Cell Wall Protein of *Sulfolobus acidocaldarius*," *J. Mol. Biol.*, vol. 167, 1983, pp. 823–852.

Gérard, Jean–Michel et al., "Prospects of High–Efficiency Quantum Boxes Obtained by Direct Epitaxial Growth," in *Confined Electrons and Photons: New Physics and Applications*, Elias Burstein Claude Weisbuch, eds., Plenum Press, New York, 1995, pp. 357–381.

Grogan, Dennis W., "Phenotypic Characterization of the Archaebacterial Genus Sulfolobus: Comparison of Five Wild–Type Strains," *J. Bacteriology*, vol. 171, No. 12, Dec. 1989, pp. 6710–6719.

Grundmann M. et al., "Ultranarrow Luminescence Lines from Single Quantum Dots," *Phys. Rev. Lett.*, vol. 74, No. 20, May 15, 1995, pp. 4043–4046.

Harrison, Christopher et al., "Lithography with a mask of block copolymer microstructures," *J. Vac. Sci. Technol. B*, vol. 16, No. 2, Mar./Apr. 1968, pp. 544–552.

Heath, J.R. et al., "Spatially Confined Chemistry: Fabrication of Ge Quantum dot Arrays," *J. Phys. Chem.*, vol. 100, 1996, pp. 3144–3149.

Heath, James R. et al, "Pressure/Temperature Phase Diagrams and Superlattices of Organically Functionalized Metal Nanocrystal Monolayers: The Influence of Particle Size, Size Distribution, and Surface Passivant," *J. Phys. Chem. B*, vol. 101, 1997, pp. 189–197.

Heinrichsdorff, F., M.H. Mao, N. Kinstaedter, A. Krost, and D.M. Bimberg, "Room–temperature continuous–wave lasing from stacked InAs/GaAs quantum dots grown by metalorganic chemical vapor deposition," *Appl. Phys. Lett.* vol. 71, 1997, pp. 22–24.

Huffaker, D.L., G. Park, Z. Zou, O.B. Shchekin, and D.G. Deppe, "1.3μm room–temperature GaAs–based quantum–dot laser," *Appl. Phys. Lett.* vol. 73, 1998, pp. 2564–2566.

Hulteen, John C. et al., "Nanosphere lithography: A materials general fabrication process for periodic particle array surfaces," *J. Vac. Sci. Technol. A*, vol. 13, No. 3, May–Jun. 1995, pp. 1553–1558.

Jackman, Rebecca J. et al., "Fabrication of Submicrometer Features on Curved Substrates by Microcontact Printing," *Science*, vol. 279, Aug. 4, 1995, pp 664–666.

Kamins, T.I., D.A.A. Ohlberg, R.S. Williams, W. Zhang, and S.Y. Chou, Positioning of self–assembled, single–crystal, germanium islands by silicon nanoimprinting, *Appl. Phys. Lett.*, vol. 74, 1999, pp. 1773–1775.

Kim, Enoch et al., "Combining Patterned Self–Assembled Monolayers of Alkanethiols on Gold with Anisotropic Etching of Silicon to Generate Controlled Surface Morphologies," *J. Electrochem. Soc.*, vol. 142, No. 2, Feb. 1995, pp. 628–632.

Kirstaedter, N. et al., "Gain and differential gain of single layer InAs/GaAs quantum dot injection lasers," *Appl. Phys. Lett.*, vol. 69, No. 9, Aug. 26, 1996, pp. 1226–1228.

Kumar et al., "Features of gold having micrometer to centimeter dimensions can be formed through a combination of stamping with an elastomeric stammp and an alkanethiol "ink" followed by chemical etching," *Appl. Phys. Lett.*, vol. 63, No. 14, Oct. 4, 1993, pp. 2002–2004.

Kumar, Amit et al., "Patterning Self–Assembled Monolayers: Applications in Materials Science," *Langmuir*, vol. 10, 1994, pp. 1498–1511.

Lembcke, G. et al., "Image analysis and processing of an imperfect two–dimensional crystal: the surface layer of the archaebacterium *Sulfolobus acidocaldarius* re–investigated," *J. Microscopy*, vol. 161, Pt. 2, Feb. 1991, pp. 263–278.

Lercel, M.J. et al., "Sub–10 nm lithography with self–assembled monolayers," *Appl. Phys. Lett.*, vol. 68, No. 11, Mar. 11, 1986, pp. 1504–1506.

Li, R.R., P.D. Dapkus, M.E. Thompson, W.G. Jeong, C. Harrison, P.M. Chaikin, R.A. Register, and D.H. Adamson, "Dense Arrays of ordered GaAs nanostructures by selective area growth on substrates patterned by block copolymer lithography," *Appl. Phys. Lett.*, vol. 76, 2000, 1689–1691.

Luedtke, W.D. et al., "Structure, Dynamics, and Thermodynamics of Passivated Gold Nanocrystallites and Their Assemblies," *J. Phys. Chem.*, vol. 100, No. 32, Aug. 8, 1996, pp. 13323–13329.

Michel, H., et al., "The 2–D Crystalline Cell Wall of *Sulfolobus acidocaldarius*: Structure, Solubilization, and Reassembly," in *Electron Microscopy at Molecular Dimensions: State of the Art and Strategies for the Future*, Wolfgang Baumeister and Wolrad Vogell, eds, Springer–Verlag, Berlin, 1980, pp. 27–35.

Moore, Jon T. et al., "Controlled morphology of biologically derived metal nanopatterns," *Appl. Phys. Lett.*, vol. 71, No. 9, Sep. 1, 1997, pp. 1264–1266.

Murray, C.B. et al., "Synthesis and Characterization of Nearly Monodisperse CdE (E = S, Se, Te) Semiconductor Nanocrystallites," *J. Am. Chem. Soc.*, vol. 115, 1993, pp. 8706–8715.

Murray, C.B. et al., "Self–Organization of CdSe Nanocrystallites into Three–Dimensional Quantum Dot Superlattices," *Science*, vol. 270, Nov. 24, 1995, pp. 1335–1338.

Ohara, Pamela C. et al., "Crystallization of Opals from Polydisperse Nanopartaicles," *Phys. Rev. Lett.*, vol. 75, No. 19, Nov. 6, 1995, pp. 3466–3469.

Ozin, Geoffrey A, Morphogenesis of Biomineral and Morphosynthesis of Biomimetic Forms, *Acc. Chem. Res.*, vol. 30, 1997, pp. 17–27.

Pearson, D.H. et al., "Nanochannel Glass Replica Membranes," *Science*, vol. 270, Oct. 6, 1995, pp. 68–70.

Pum, Dieter et al., "Anisotropic crystal growth of the S–layer of *Bacillus sphaericus* CCM 2177 at the air/water interface," *Colloids and Surfaces A: Physicochemical and Engineering Aspects*, vol. 102, 1995, pp. 99–104.

Sleytr, Uwe B. et al., "Crystalline Surface Layers on Bacteria," *Ann. Rev. Microbiol.*, vol. 37, 1983, pp. 311–319.

Sleytr, Uwe B. et al., "Two–Dimensional Protein Crystals (S–Layers): Fundamentals and Application Potential," *Mat. Res. Soc. Symp. Proc.*, vol. 330, 1994, pp. 193–199.

St. John, Pamela M. et al., "Microcontact printing and pattern transfer using trichlorosilanes on oxide substrates," *Appl. Phys. Lett.*, vol. 68, No. 7, Feb. 12, 1996, pp. 1022–1024.

Taylor, K.A. et al., "*Structure of the S–layer of Sulfolobus acidocaldarius,*" *Nature*, vol. 299, Oct. 28, 1982, pp. 840–842.

Weiss, Richard L., "Subunit Cell Wall of *Sulfolobus acidocaldarius,*" *J. Bacteriology*, Apr. 1974, pp. 275–284.

Whetten, Robert L. et al., "Nanocrystal Gold Molecules," *Adv. Mater.*, vol. 8, No. 5, 1996, pp. 428–433.

Wilbur, James L. et al., "Microfabrication by Microcontact Printing of Self–Assembled Monolayers," *Adv. Mater.*, vol. 6, No. 7/8, 1994, pp. 600–604.

Jeffrey M. Calvert et al., "Deep Ultraviolet Lithography Monolayer Films with Selective Electroless Metallization," *J. Electrochem. Soc.*, vol. 139, No. 6, Jun. 1992, pp. 1677–1680.

Jeffrey M. Calvert et al., "Photoresist channel–constrained deposition of electroless metallization on ligating self–assembled films," *J. Vac.Sci. Technol. B,* vol. 12, No. 6, Nov./Dec. 1994, pp. 3884–3887.

Douglas, Kenneth et al., "Nanometer Molecular Lithography," *Appl. Phys. Lett.*, vol. 48, No. 10, Mar. 10, 1986, pp. 676–678; correction in *Appl. Phys. Lett.*, vol. 48, No. 26, Jun. 30, 1986, p. 1812.

Douglas, Kenneth et al., "Transfer of Biologically Derived Nanometer–Scale Patterns to Smooth Substrates," *Science,* vol. 257, Jul. 31, 1992, pp. 642–644.

Geis, M. W. et al., "Self–developing resist with submicrometer resolution and processing stability," *Appl. Phys. Lett.*, vol. 43, No. 1, Jul., 1983, pp. 74–76.

Geis, M. W. et al., "Nitrocellulose as a positive or negative self–developing resist," *J. Vac. Sci. Technol. B,* vol. 3, No. 1, Jan./Feb. 1985, pp. 343–346.

Kaneko et al., "Self–Development Properties of Nitrocellulose (Dependence on Ion Species)," *Japanese Journal of Applied Physics*, vol. 28, No. 4, Apr. 1989, pp. 716–719.

Kaneko et al., "Self–Development Properties of Nitrocellulose (Dependence on Ion Energies)," *Japanese Journal of Applied Physics*, vol. 28, No. 6, pp. 1113–1117.

Van der Gaag, B.P. et al., "Microfabrication below 10 nm," *Appl. Phys. Lett.,* vol. 56, No. 5, Jan. 29, 1990, pp. 481–483.

\* cited by examiner (a)

INTERMEDIATE TRANSFER LAYERS FOR NANOSCALE PATTERN TRANSFER AND NANOSTRUCTURE FORMATION

The U.S. government has a paid-up license in this invention and the right in limited circumstances to require the patent owner to license to others on reasonable terms, as provided for by the terms of the contract numbered F49620-99-1-0105, awarded by the Air Force Office of Scientific Research.

BACKGROUND OF THE INVENTION

1. Field of the Invention

The present invention relates generally to a method for manufacturing an array of nanostructures and a substrate with an ordered array of nanostructures, wherein the nanostructure size is controlled, and to a substrate including an ordered array of nanoclusters. More particularly, the method comprises etching structures into a substrate and/or depositing adatoms onto the substrate through a patterned mask and an intermediate transfer layer between the mask and the substrate.

2. Description of Related Art

The ability to control function by controlling size makes nanoclusters very attractive for technological applications in high-speed computing, high density data storage and display, and optical communications through devices such as the single-electron transistor and the quantum dot laser. Designs for such devices require not only sharp control of nanocluster size, but also fabrication of ordered arrays of nanoclusters and, in some cases, interconnections between clusters within the array.

As has been discussed elsewhere [for example, J.-M. Gerard (1995)], single layer quantum dot arrays have been demonstrated to have excellent optical properties such as high quantum efficiency, long radiative lifetimes, and very fast PL rise times. However, direct growth has been stymied by "the prerequisite of an ultrafine lithographic definition of the mask."

Dramatic advances have been made recently in obtaining ordered arrays of nanoclusters from liquid phase syntheses by selective precipitation and Langmuir-Blodgett techniques [Murray et al. (1993); Ohara et al. (1995); Murray et al. (1995); Whetten et al. (1996); Luedtke et al. (1996); Heath et al. (1997)]. Ordered arrays have also been produced using films of close-packed polystyrene spheres as deposition masks [Hulteen et al. (1995)]. Ensembles of individual, size-controlled InP quantum dots grown by self-assembly in molecular beam epitaxy on a GaAs surface have emitted light of very narrow bandwidth at a wavelength determined by the size of the dots [Grundmann et al. (1995)]; embedded between electron-injecting and hole-injecting layers, these dots have exhibited lasing [Kirstaedter (1996)]. However, because they grow at randomly distributed nucleation sites on the substrate, their location is difficult to control.

From the point of view of device fabrication, it is desirable to first define the desired nanoscale array pattern directly on the substrate and then grow or deposit the nanoclusters on the patterned substrate. The nanoclusters produced preferably have diameters less than about 25 nm to show true quantum confinement behavior.

In earlier work, Heath and co-workers studied the formation of clusters in confined geometries by defining 100 and 150 nm diameter holes in a thin oxide mask over a Si wafer and then growing Ge clusters on the Si surfaces exposed in the etched holes [Heath et al. (1996)]. They observed a few clusters in each 150 nm hole at locations distributed over the bottom of the hole. A few of the 100 nm holes contained a single cluster, but difficulties with that sample precluded complete analysis. Their results showed that the confining geometry of the 150 nm hole limited the number and size of clusters growing in the hole but did not precisely control their location.

To manufacture functional devices incorporating nanostructures, it is important to obtain a precise spatial arrangement of the quantum dot array and a uniform size and composition of the individual dots. However, two-dimensional arrays of quantum dots fabricated by the self-assembled growth of strained islands of materials using the Stranski-Krastanow growth mode typically exhibit a randomness of spatial nucleation [Huffaker et al. (1998); Heinrichdorff et al. (1997)]. Recently, studies using pre-patterned surfaces formed by nanoimprinting have been shown to promote improvement in the spatial uniformity of dot nucleation [Kamins et al. (1999)]. Also, selective area growth employing block copolymer lithography has achieved a high degree of uniformity in the spatial position of dense arrays of nanoscale dots with the diameter of the dots estimated to be 23 nm [Li et al. (2000)]. The dots are hexagonally close packed and are organized into domains roughly 1 $\mu$m in size.

Nevertheless, smaller dots are desirable for use in quantum dot devices. Further, there remains a need for a method of forming nanostructures on a variety of substrates having differing surface properties.

Thus, there is a need for a method for transferring nanoscale patterns to a wider variety of substrates to facilitate manufacture of a wider range of quantum dot type devices.

SUMMARY

It is an object of the present invention to provide a method for applying nanopatterns to substrates having greater surface roughnesses than has hitherto been possible.

It is another object of the present invention to provide a method for applying nanopatterns to substrates with intrinsic surface chemistries that are inappropriate for the successful application of nanomasks directly to the surface to be patterned.

It is a yet another object of the present invention to provide a method for using nanomasks to apply nanopatterns to substrates without roughening, degrading, or otherwise damaging the newly nanopatterned surface.

It is still another object of the present invention to provide a method for removing nanomasks after application of nanopatterns to substrates without roughening, degrading, or otherwise damaging the newly nanopatterned surface.

It is a further object of the present invention to provide a method for transferring a nanoscale pattern to a substrate via dry etching when there is insufficient etch selectivity between the mask and the surface to be patterned.

It is yet a further object of the present invention to create arrays of nanostructures on a substrate surface by replicating the inverse of a nanomask pattern onto the substrate surface without first creating wells or holes in the substrate.

One embodiment of the present invention comprises a method for producing an ordered array of nanostructures on a substrate surface. The method includes the steps of providing a substrate; forming an intermediate transfer layer on the substrate surface; mounting a mask template on the intermediate transfer layer; and etching a pattern through the intermediate transfer layer, wherein the pattern substantially replicates the size and spacing of the ordered array of nanoscale holes in the mask template. The mask template includes an ordered array of nanoscale pores therein, and the etching step may comprise forming an array of wells in the substrate.

The method may include an additional step of applying a coating to the mask template to form a patterning mask. Other optional steps include removing the mask template from the intermediate transfer layer, modifying the surface properties of the intermediate transfer layer prior to the mounting step, and depositing adatoms onto the substrate surface through the pattern of wells in the intermediate transfer layer. There may also be a step of modifying the substrate surface where it is exposed by the etching step. Adatoms may be deposited or adsorbed onto the modified substrate surface, either prior to or after removal of the intermediate transfer layer.

In accordance with the method for producing the ordered array of nanostructures on the substrate surface, the substrate may comprise a material having a surface roughness greater than about 1 nm RMS roughness. The mask template may comprise a material selected from inorganic crystalline materials, glass, block copolymers, naturally occurring biological materials, modified biological materials, and biomimetically grown materials. The intermediate transfer layer may comprise a self-developing resist, such as formvar, polyimide, photoresists, PMMA nitrocellulose, ammonium perchlorate, oxalic acid, or picric acid.

Another embodiment of the present invention comprises a method for producing an ordered array of nanostructures on a substrate surface. The method includes the steps of providing a substrate, forming an intermediate transfer layer on the substrate, mounting a mask template on the intermediate transfer layer, transferring a first pattern comprising an ordered array of nanostructures to the intermediate transfer layer, and transferring a second pattern to the substrate. The first pattern may be transferred to the intermediate transfer layer by deposition of adatoms onto the intermediate transfer layer, etching wells into the intermediate transfer layer, and combinations thereof. The second pattern may be transferred to the substrate by a method selected from dry etching, deposition of adatoms onto the substrate, and combinations thereof. In the method, the first pattern in the intermediate transfer layer includes an ordered array of nanostructures corresponding to nanoscale pores in the mask template, and the second pattern may comprise an ordered array of nanostructures corresponding to either the mask template pattern or the inverse of the mask template pattern.

Either of the pattern transfer steps may include dry etching, such as inductively coupled plasma etching. The use of the intermediate transfer layer may facilitate the use of materials for the mask template and the substrate that have similar etch rates to obtain etched features in the substrate.

Yet another embodiment of the present invention comprises a substrate having a surface and including an ordered array of nanostructures, wherein the substrate surface is hydrophobic, has a RMS roughness greater than about 1 nm RMS roughness, has an etch rate substantially similar to the etch rate of a patterning mask used to form the ordered array of nanostructures, and/or is substantially without wells for containing the nanostructures. The nanostructures may be selected from clusters of adatoms, wells, and combinations thereof. The features may have diameters between about 2 nm and about 10 nm, and the lattice spacing may be between about 3 nm and about 30 mn.

BRIEF DESCRIPTION OF THE DRAWINGS

These and other features, aspects, and advantages of the present invention will become better understood with reference to the following description, appended claims, and accompanying drawings, where:

DETAILED DESCRIPTION

Parallel processing methods incorporating nano scale masks have been described in copending U.S. patent applications Ser. Nos. 09/583,209, filed May 30, 2000, and 09/642,135, filed Aug. 18, 2000, and in Winningham et al. [1998], all of which are incorporated herein by reference in their entirety. These methods have been used to create nanometer-scale patterns on a surface, with pattern features that are sufficiently small to control nucleation and growth of materials deposited on that surface, thereby producing an ordered array of nano clusters in which each cluster is precisely located at a position determined a priori. After arrays of wells have been etched, a single nanocluster has been formed in each of the etched wells by self-organization of deposited adatoms. The symmetry and lattice constant of the array are identical to those of the etched wells, demonstrating that these extremely small wells control the position as well as the number of clusters grown in each well. Further, the etched wells are small enough to reduce the diffusion field of adatoms within the holes so severely that subsequent nucleation is suppressed after the first cluster has formed in each well. Using these methods of nanofabrication, ordered arrays of holes having diameters in the range of about 1 to about 30 nm and ordered arrays of single nanoclusters having diameters of about 5 nm have been produced.

Such parallel processing methods are analogous to the optical lithography and wide area etching used routinely today in microfabrication and are highly desirable to ensure the manufacturability of nanostructures and to realize thereby the technological promise offered by devices in the nano regime. The nanoclusters formed by these parallel processing methods can be produced via a highly scalable method for the inexpensive, parallel fabrication of dense, ordered arrays of semiconductor quantum dots that can serve in single layers as the emissive elements in active layers of electroluminescent devices, such as flat panel displays, ultrathin displays deployed on flexible substrates, and vertical-cavity surface-emitting lasers (VCSELs). The dots or holes within an array have a highly uniform size and spacing, arising naturally from the inherent order of the nanometer-scale masks employed to create the quantum dots. The formation of the dot arrays can proceed in a very straightforward way using a highly selective dry etching process followed by conventional molecular beam epitaxy. Moreover, the technique does not require a strain field or complex growth kinetics as are often employed in multilayer quantum dot designs for VCSELs.

However, until now, use of these methods has been limited to substrates with surfaces smooth enough for the masks to make good contact with the substrate surface (i.e., an RMS roughness less than about 1 nanometer) and hydrophilic enough for the aqueous suspension to spread over the surface and allow the flat surfaces of the etch masks to adhere to the substrate surface. Attempts to use nonaqueous liquids to suspend the etch masks have been unsuccessful due to clumping of the masks. Further, removal of the masks after etching may result in roughening or other degradation of the newly nanopatterned substrate surface. Also, pattern transfer via the methods described in these copending applications requires that there is sufficient etch selectivity between the mask surface and the substrate surface for pattern transfer in a single step. Further, pattern transfer via these methods has required etching wells or holes into the substrate and subsequent deposition of adatoms into the wells.

In accordance with the present invention, nanoscale masks can be used to transfer patterns to a wide range of substrates having a wide range of compositions and surface properties. The use of an intermediate transfer layer between the masks and the substrate allows the use of a wider range of substrates and a wider range of mask materials than has hitherto been possible, as well as allowing a greater variety of etching and deposition processes to form devices having ordered arrays of nanostructures. Indeed, the intermediate transfer layer itself can be used as an etch mask for pattern transfer to the substrate.

As used herein, the term "nanostructures" includes three-dimensional nanoscale features, which may be positive structures or holes. It should be noted that at least one dimension of the structures may be extremely small, measured, for example, in atomic layer thicknesses.

The use of the intermediate transfer layer between the mask and the substrate surface to be patterned can accomplish several important functions, including but not limited to:

allowing the use of nanomasks to pattern surfaces whose RMS surface roughness is greater than about 1 nm for high fidelity patterning;

allowing the use of nanomasks to pattern surfaces whose intrinsic surface chemistry is inappropriate for the successful deployment of nanomasks directly to the surface to be patterned, such as when the surface is not sufficiently hydrophilic;

facilitating the removal of nanomasks and the intermediate transfer layer after pattern transfer is complete without roughening, degrading, or otherwise damaging the newly nanopatterned surface;

facilitating pattern transfer in cases where there is insufficient etch selectivity between the mask and the surface to be patterned, such as by allowing for a two step pattern transfer process employing one set of etch conditions to pattern transfer from the nanomask to the intermediate transfer layer and a second set of etch conditions to complete the pattern transfer from the intermediate transfer layer to the underlying surface; and allowing replication of the inverse of the nanomask pattern onto a substrate surface without first creating wells or holes in the substrate surface.

Figure 1:
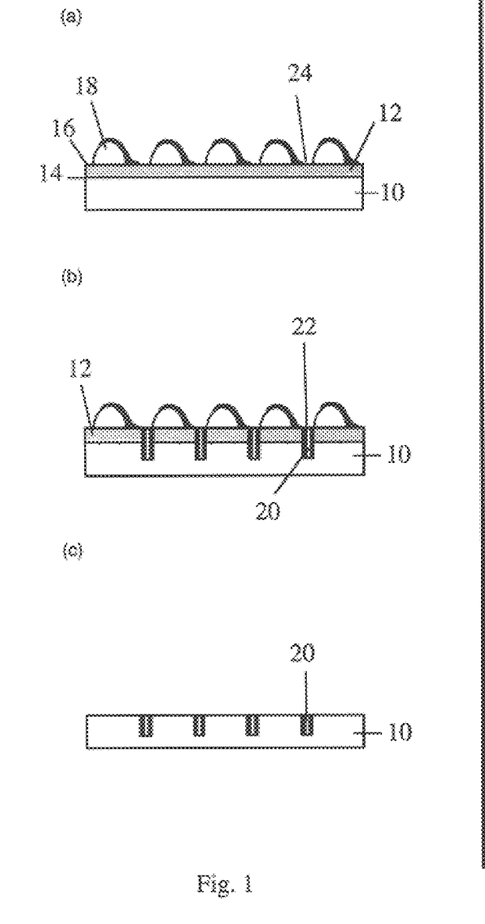
FIG. 1(a) is a schematic representation of a cross section of a substrate to which an intermediate transfer layer, and a mask template have been applied in accordance with the present invention.
FIG. 1(b) is a cross section of the substrate, intermediate transfer layer, and mask template of FIG. 1(a) with holes etched through the mask template and intermediate transfer layer and into the substrate.
FIG. 1(c) is a cross section of the substrate of FIGS. 1(a) and (b) after removal of the patterning mask, mask template, and intermediate transfer layer.

Referring to FIG. 1, in accordance with the present invention, a substrate 10 may comprise any material on which an intermediate transfer layer 12 can be deposited. In particular, the substrate surface 14 may have a surface roughness greater than about 1 nm RMS roughness. Previously, nanomasks were directly mounted on substrate surfaces, and use of such masks was limited to substrates having surfaces that were smooth on the scale of the repeat interval of the mask, with surface roughnesses less than about 1 nm RMS.

It may be desirable to clean the substrate surface 14 prior to applying the intermediate transfer layer 12. For substrate materials having a sheetlike crystal structure, such as highly ordered pyrolytic graphite (HOPG) or mica, the top surface can be cleaved away, leaving an atomically flat, clean surface. For other materials, such as silicon, the surface is preferably cleaned using a chemical cleaning solution to remove contaminating organic compounds and hydrocarbons.

One type of substrate material used commonly in electronic devices is silicon. Silicon substrates generally have a native 2–5 nm thick $SiO_2$ surface layer, which may increase in thickness with chemical cleaning. However, certain etch processes require a minimal $SiO_2$ thickness. For these processes, after chemical cleaning, the substrates may be dipped in buffered hydrofluoric acid (HF) to remove the $SiO_2$ layer and then cleaned in an oxygen plasma to produce an oxide layer approximately 2 nm thick.

Once a surface is cleaned, it can be further modified with suitable functional groups or with a thin layer of a suitable material for adherence of the intermediate transfer layer or adherence of other materials in subsequent process steps.

Referring again to FIGS. 1 and 2, materials suitable as an intermediate transfer layer 12 must be chemically compatible with the mask template material and the substrate 10, able to be applied in a very thin layer, and exhibit a high etch rate. Intermediate transfer layers comprising a resist-like material are readily amenable to pattern transfer from bio-nanomasks. Preferably, the intermediate transfer layer material is removable from the substrate without using corrosive materials, thereby minimizing damage to the substrate. More preferably, the intermediate transfer layer material comprises an organic material which is easily soluble in one or more common organic solvents to facilitate removal without damaging the substrate. Examples of suitable intermediate transfer layer materials include self-developing resists, such as formvar, polyimide, photoresist, e-beam resist, PMMA, and nitrocellulose. Most preferably, the intermediate transfer layer material comprises nitrocellulose having a nitrogen content between about 11.8 percent and about 13.5 percent. Other suitable self-developing resists include ammonium perchlorate ($NH_4CLO_4$), oxalic acid (HOOCCOOH), and picric acid ($C_6H_2(NO_2)_3OH$).

Figure 2:
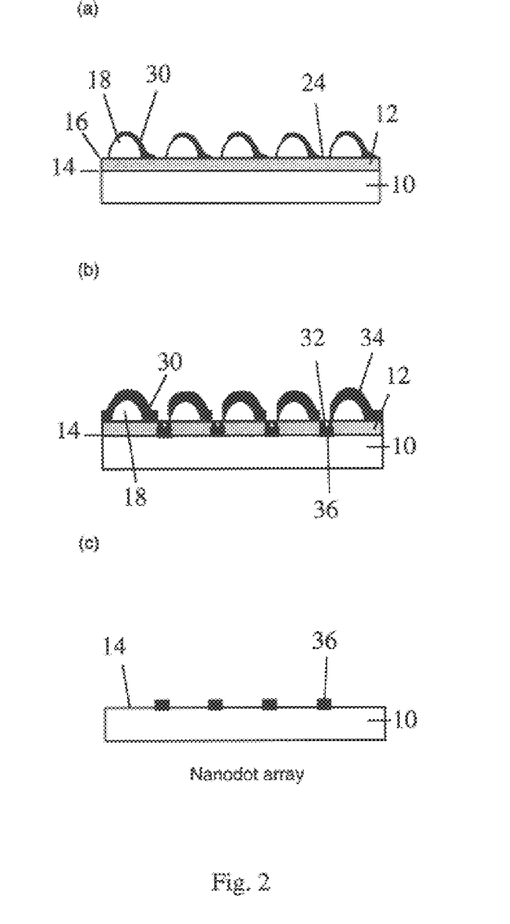
FIG. 2(a) is a schematic representation of a cross section of a substrate to which an intermediate transfer layer, a mask template, and a patterning mask have been applied in accordance with the present invention.
FIG. 2(b) is a cross section of the substrate/mask assembly shown in 2(a) with holes etched through the intermediate transfer layer and material deposited on the patterning mask and in the etched holes.
FIG. 2(c) is a cross section of the substrate shown in FIGS. 2(a) and (b), with the intermediate transfer layer, mask template, and patterning mask removed.

The intermediate transfer layer 12 may be applied to the substrate surface 14 by any manner known to those skilled in the art to produce a layer with the desired thickness, smoothness, and uniformity. It may be desirable to minimize film thickness, while maintaining uniformity of the coating. Preferably the layer 12 is between about 5 nm and about 10 nm thick, has a surface 16 facing away from the substrate 10, has an RMS roughness less than about 1 nm, and is substantially free of pinholes and other structural defects. In a preferred embodiment, the intermediate transfer layer material is applied in solution to a spinning substrate, and the solvent is then allowed to evaporate. The applied film thickness can be controlled by controlling the spinning speed and the dilution of the intermediate transfer layer material in the solvent.

The intermediate transfer layer 12 should be selected so that its surface is suitable for mounting the mask template 18 or templates. For example, if bacterial S-layers are used as mask templates, as described below, the intermediate transfer layer surface preparation preferably fulfills three requirements. First, the S-layer or layers should be adsorbed onto the intermediate transfer layer with the sculpted cytoplasmic side up, to provide for more accurate pattern transfer to the intermediate transfer layer and the substrate. Therefore, the intermediate transfer layer surface is preferably adapted to attract the smoother exoplasmic side of the S-layers. Preferably, the attraction is strong enough to keep the adsorbed S-layers from being moved significantly by the water as it evaporates. Also, the surface preferably yields monolayer patches of S-layer material if the correct concentration of S-layers is applied. It may be desirable to apply a coating to the intermediate transfer layer surface to alter the wettability of the surface.

Referring again to FIG. 1, in accordance with the present invention, any material which comprises a sheet-like structure and incorporates a regular, repeating array of holes can be used as a mask template 18 for formation of nanostructures 20. For example, inorganic molecules having a porous crystal structure, such as zeolite-type compounds, could be used. Alternatively, a thin film of diblock copolymers could be created with an array of nanometer-scale holes, or masks could be created by drawing a group of glass capillaries out until the inner diameters are of nanometer-scale dimensions, by using naturally occurring biological materials, by modifying naturally occurring masks, by using chemical self-assembly, or by using biomimetic growth methods, as described in Harrison et al. (1998); Pearson et al. (1995); Pum et al. (1996); Moore et al. (1997); Kim et al. (1995); Jackman et al. (1995); and Ozin et al. (1997), all of which are incorporated herein by reference, in their entirety.

A preferred type of mask 18 is a crystalline material of biological origin. For example, some species of bacteria have a two-dimensional crystalline protein layer which forms the external surface of the membranes of the bacteria. This layer is known as the S-layer and has regularly spaced pores. S-layers exist with a variety of lattice constants between about 3 and about 30 nm; different symmetries, such as square, hexagonal, and oblique; and varying pore diameters [Sleytr et al. (1983), incorporated herein by reference in its entirety]. S-layers from two strains of bacteria from the genus Sulfolobus, isolated from hot springs, *Sulfolobus acidocaldarius* and *Sulfolobus solfataricus*, have been found useful. The S-layers from these bacteria have hexagonal pore arrays that are periodic and remain stable in harsh conditions, and were, therefore, employed as patterning masks.

The S-layer of the bacteria *Sulfolobus acidocaldarius* comprises crystals having an hexagonal array of pores 5 nm in diameter with a lattice constant of 22 nm. Although the symmetry of the protein and the pores is more properly labeled trigonal because there are three groups of protein dimers around each pore, the symmetry will hereinafter be referred to as hexagonal [Taylor et al. (1982); Deatherage et al. (1983); and Lembcke et al. (1991); all incorporated herein by reference in their entirety]. The protein making up the crystal is a glycoprotein of molecular weight 140 kD. The cytoplasmic side of the S-layer, the side that faces the inside of the bacterium, is sculpted, while the exoplasmic side, the side facing away from the bacterium, is relatively smooth with attached carbohydrate chains. Crystalline samples have been prepared by the inventors with dimensions of about 1–2 $\mu$m; other workers have reported samples as large as 50 $\mu$m in extent.

It is preferable to obtain clean, isolated S-layers for use as patterning masks. Usable S-layers are preferably free of contamination that might block the pores; they preferably yield fragments that can be deposited onto a substrate without clumping or sticking together; and they preferably yield fragments that retain the S-layer's natural stability, with edges that remain intact and do not fray or fall apart. It should be noted that the parameters that produce the fastest and most abundant bacterial growth do not necessarily result in the cleanest S-layers.

Methods and media for culturing *S. acidocaldarius* and *S. solfataricus* are described in copending U.S. patent applications Ser. Nos. 09/583,209 and 09/642,135. *S. acidocaldarius* is a lobed or roughly spherical bacterium, and to allow use of the nanometer-scale, periodic pattern of the S-layer, the S-layer is preferably isolated intact from the cells. Many isolation protocols have been developed, such as those described in Weiss (1974); Michel (1980); and Grogan (1989); all of which are incorporated herein by reference, in their entirety. These isolation procedures leave the S-layer protein as intact sacculi, or whole sacs. For use in accordance with the present invention, the sacculi are preferably broken up into fragments that can lie flat on a substrate.

An attractive way to improve S-layer quality is to solubilize the protein crystal and recrystallize it. All S-layers are held together by differing combinations of non-covalent bonds (hydrophobic bonds, ionic bonds, and hydrogen bonds) [Sleytr et al. (983)]. Chaotropic agents such as guanidine hydrochloride or urea may solubilize S-layers held together by hydrogen bonds. Once the S-layer is solubilized into protein monomers, the S-layer protein may be collected, separated from all contaminants, and allowed to recrystallize by removing the disrupting agent. In fact, Michel et al. (1980), used three different methods to solubilize and reassemble the S-layer from *Sulfolobus acidocaldarius*. Furthermore, recrystallization has the added advantage that it can be used to obtain perfect (defect-free) crystals much larger than those isolated from bacteria. Sleytr et al. (1994), incorporated herein by reference in its entirety, have recrystallized perfect S-layer crystals 20 $\mu$m in diameter. The recrystallized S-layers were even strong enough to span 10 $\mu$m holes in a "holey" carbon film without breaking. It may be possible to create "designer S-layers" in which the recrystallization is directed by a patterned substrate to yield protein crystals of a designed shape and size.

In accordance with the present invention, the mask templates 18 are applied to the surface 16 of the intermediate transfer layer 12 by any suitable method. For example, a drop of a suspension template particles in a suitable liquid may be deposited onto the substrate of choice. Preferably, most of the liquid is then removed, such as by wicking with absorbent paper, and the particles then adsorb onto the surface of the substrate as the remaining liquid evaporates. It may be preferable to further dry the substrate by a method which ensures that the templates remain as dispersed monolayers on the substrate and that the structure of the templates is distorted as little as possible. If the liquid is aqueous, suitable drying methods include air drying, use of alcohol solutions with varying ratios of alcohol/water, and critical point drying.

If S-layers are used as mask templates, the intermediate transfer layer surface is preferably hydrophilic to facilitate S-layer adhesion. The drop of water in which the S-layers are suspended will wet a hydrophilic surface completely, thereby ensuring a good coverage of S-layers. Also, most of the water can be wicked off easily, such as with a piece of filter paper. The surface of this film will move almost vertically as the water evaporates, ensuring that the S-layers stay dispersed as they adsorb onto the surface.

If the surface is hydrophobic, the drop of water in which the S-layers are suspended will not wet the surface but will form a hemispherical drop, and consequently, the coverage of S-layers on the surface will be poor. More importantly, as the water evaporates, the drop will shrink in size, and the sides of the drop will move parallel to the surface. The surface tension of the water will drag the S-layers with it creating a pile of S-layers centered at the point where the drop evaporates. However, addition of a surfactant to the aqueous suspension may decrease the surface tension sufficiently to enhance the ability of the suspension to wet a hydrophobic surface.

It should be noted that if other types of mask template material are used, appropriate liquids may be selected to suspend the templates, based on the surface properties of the mask templates 18 and the intermediate transfer layer 12.

The pattern of the mask template 18 can be transferred to the intermediate transfer layer 12 and/or the substrate 10 in various ways, shown schematically in FIGS. 1 and 2, where hole sites 20 and 22 correspond to pore sites 26 in mask templates 18. As shown in FIGS. 1(*b*) and (*c*), holes 20 and 22 may be etched through the intermediate transfer layer 12 and into the substrate 10. Subsequently, nanoclusters of adatoms may be deposited in the holes 20 in the substrate 10 to form quantum dots.

Preferred methods of pattern transfer include low energy dry etching methods, such as inductively coupled plasma (ICP) etching. Preferably, the mask template 18 has a surface suitable for use with the method selected for transferring the pattern to the substrate 10. For example, organic materials, such as S-layers, may degrade upon exposure to the etchant. Thus, it may be desirable to apply a patterning mask 30 to the mask template 18 to facilitate pattern transfer, as shown in FIG. 2(*a*). For dry etching, a preferred mask surface comprises a thin layer of a fine-grained inorganic material, such as a metal or metal oxide, which may be deposited on the S-layer or other porous crystalline template 18 after mounting the mask template 18 on the intermediate transfer layer surface 16 by any suitable method known in the art. Suitable fine-grained metals and oxides include titanium, chromium, vanadium, tungsten; oxides of titanium, chromium, vanadium, and tungsten; and combinations thereof. FIGS. 2(*a*) and (*b*) illustrate a metal or metal oxide layer patterning mask 30 deposited on a mask template 18.

Following pattern transfer, the mask template 18 and the intermediate transfer layer 12 may be stripped from the substrate 10, such as by dissolving the intermediate transfer layer 12 in suitable solvent. It may also be desirable to physically remove the mask templates, such as by swabbing the template surface.

After the mask template 18 is removed from the substrate 10, a material can be deposited or formed in the arrayed holes, or wells 20, in the substrate 10 by suitable means, depending on the substrate composition and the composition of the desired material. The diameter of the nanoclusters may be selected by selecting a mask template material with the desired pore size or by varying the effective diameter of the pore sites when etch mask 30 is formed, such as by the method described in copending U.S. patent application Ser. No. 09/642,135. Due to the size of the holes or wells 20, the material may be in the form of nanoclusters that function as quantum dots.

Alternatively, if the holes penetrate the intermediate transfer layer but not the substrate material, nanoclusters or other nanoscale structures may be formed or deposited on the substrate surface. As shown in FIG. 2(*b*), the nanomask pattern may be etched into the intermediate transfer layer 12 in the form of holes 32. Then, a material 34 and 36 can be deposited over the entire outer surface of the patterning mask 30 and inside holes 32 on the exposed portions of substrate surface 14. Subsequent removal of the intermediate transfer layer 12 and the patterning mask 30 and mask template 18 resting on the intermediate transfer layer 12 leaves an ordered array of dots 36 on the substrate surface 14, with the dots 36 comprising the material deposited through the cylindrical holes 24 in the intermediate transfer layer 12. The arrayed dots 36 are arranged in the inverse of the mask pattern, with the dots 36 corresponding to holes 24 in the mask template 18.

It may be desirable to alter the substrate surface 14 to facilitate proper deposition of material on substrate 10 or removal of material from substrate 10, such as by adding a surface functionality that facilitates adherence of the feature material to be deposited or facilitates removal of the substrate material during etching. This treatment may be performed either prior to deposition of the intermediate transfer layer 12 on the substrate 10, or after holes 22 or 32 are etched through the intermediate transfer layer 12. For example, an $SiO_2$ surface may be modified with an organosilane, such as an alkyl silane or a mercapto silane, to create a self-assembled monolayer (SAM). This SAM becomes the new surface of the substrate, supplanting the chemical properties of the original surface with the properties of the functional group on the organosilane. Organosilane SAMs have the added advantage that they can be used to create a pattern on the surface because the alkyl or mercapto functional group can be cleaved with 193 nm light. These patterns can be used for selective deposition of metals, protection against wet chemical etchants, and selective adsorption of biological materials (see for example, Bhatia et al. (1993), Kumar and Whitesides (1993), Kumar et al. (1994), Wilbur et al. (1994), Kim et al. (1995), Lercel et al. (1996), and St. John and Craighead (1996), all of which are incorporated herein by reference in their entirety).

The following nonlimiting examples are provided to further illustrate the invention. All etching in the examples was accomplished by inductively coupled plasma etching using an MESC Multiplex ICP manufactured by Surface Technology Systems Ltd, Imperial Park, Newport, NP10 8UJ, United Kingdom.

EXAMPLE 1

Etching Ti-coated S-layers on silicon substrates with $SF_6$ as an etchant

S-layers are mounted on silicon substrates and coated with 12 Å of Ti. The Ti oxidizes to form 35 Å layer of $TiO_2$. The samples are etched, with etch parameters varied around an initial set of conditions: 10 sccm $SF_6$, 5 mTorr, 100 W coil power (CP), 1 W platen power (PP), 30 seconds. When the $SF_6$ is exposed to the plasma, it decomposes and yields reactive fluorine species. The etch rate of the $TiO_2$ coating on the S-layers by the F species derived from $SF_6$ is too great to allow transfer of the bionanomask pattern into the Si substrate before the $TiO_2$ coating and the protein of the S-layers are significantly degraded.

EXAMPLE 2

Etching experiments with Cr-coated silicon substrates

To determine the etch rate of Cr mask material, Si(100) samples are cleaned in a piranha solution (3:7 $H_2O_2$:$H_2SO_4$). Next, 50 nm of Cr is deposited on these samples using e-beam evaporation. Photoresist (Shipley 1805) is spun on the Cr and exposed beneath a 1000-mesh TEM grid used as a contact mask. The TEM grid has square windows about 20 $\mu$m on a side and separated by about 8 $\mu$m. The samples are cleaned in an oxygen plasma (20 sccm $O_2$, 5 mTorr, 400 W CP, 5 W platen power, 10 seconds) to remove any remaining photoresist in the exposed areas. The samples are then etched with 10 sccm $SF_6$ at 4 mTorr and 100 W CP for 60 seconds at a platen power of 0, 1, 2, 3, 4, 5, 10, 20 W. The photoresist is removed with acetone, and the etch depth is measured by atomic force microscopy (AFM). All samples, including a control sample that received an oxygen plasma but no $SF_6$ exposure, are etched to a depth of 8 nm, indicating that there is no discernable etching by the $SF_6$. The 8 nm etch depth results from exposure to the $O_2$ plasma.

EXAMPLE 3

Etching $SiO_2$-coated substrates with $SF_6$ as an etchant $SiO_2$ substrates are prepared by thermally growing about 250 nm of $SiO_2$ on Si wafers. The substrates are then masked with patterned photoresist and etched as in Example 2. All samples, including the control, are then etched to a depth of about 1 nm, again indicating that the $SF_6$ does not etch the $SiO_2$ significantly under these conditions.

The experiments described in Examples 2 and 3 indicate that Cr is a good etch mask, but the oxide on the Si must be substantially removed before etching.

EXAMPLE 4

Etch rate of Si with oxide coating removed and varying platen powers

Figure 3:
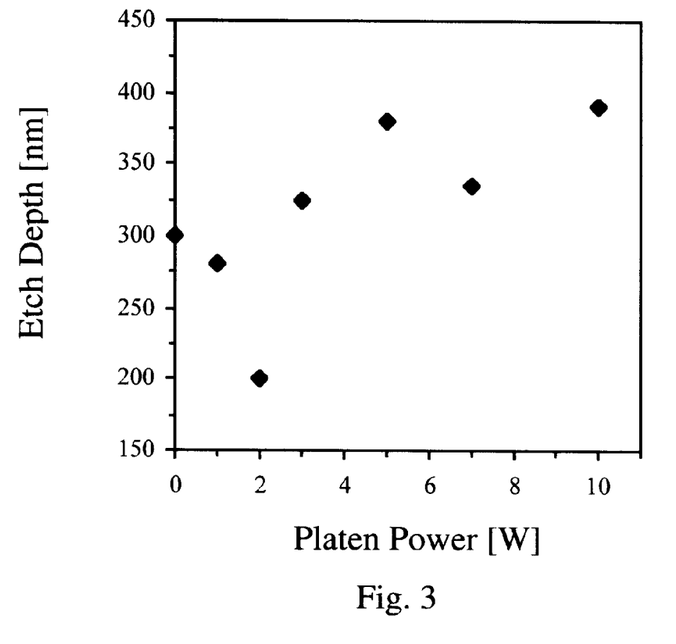
FIG. 3 is a graph of etch depth vs. platen power.

A set of parametric experiments is performed to determine the etch rate of the Si. Si samples are cleaned in a piranha solution and dipped in a 10% hydrofluoric (HF) acid solution to remove the native oxide. 1.2 nm of Cr is deposited through 1000-mesh transmission electron microscope (TEM) grids onto each sample to create arrays of Cr squares on the Si surfaces. The samples are then etched in 5 sccm $SF_6$ at 4 mTorr and 100 W CP for 60 seconds at platen powers of 0, 1, 2, 3, 5, 7, and 10 W. The etch depth is then measured by AFM. FIG. 3 shows the etch depth as a function of platen power. There appears to be a slight increase in etch rate as a function of platen power.

EXAMPLE 5

Etch depth as a function of time with fixed platen power

Figure 4:
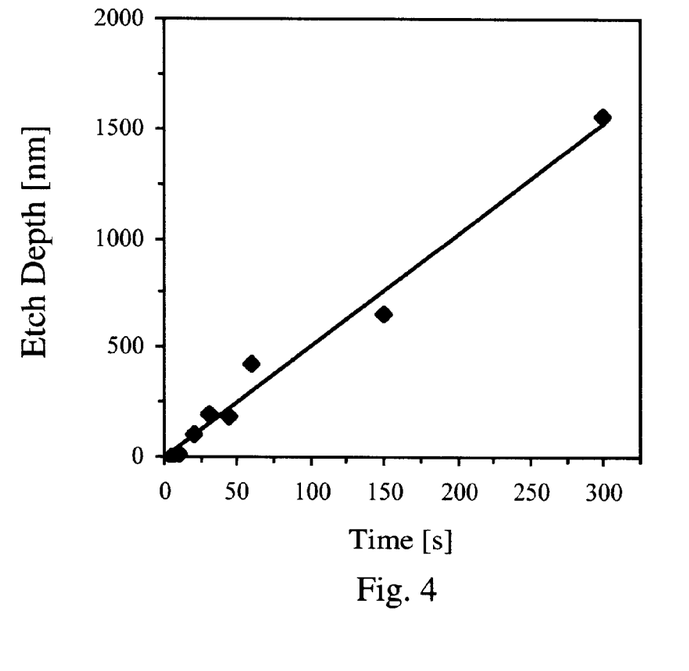
FIG. 4 is a graph of etch depth vs. time for a fixed platen power of 1 W.

Samples of Si are prepared and etched as described in Example 4, with the exception that the platen power is fixed at 1 W and the etch times are 5, 10, 20, 30, 45, 60, 150, and 300 seconds. FIG. 4 shows the etch depth as a function of etch time. The plot is linear, indicating an etch rate of about 5 nm/sec. There appears to be a short incubation period at the beginning of etching, possibly due to a thin oxide layer present on the surface of the Si. Even though the initial $SiO_2$ layer is removed from the Si sample surface with HF, a thin oxide layer reforms on the surface before the sample can be loaded into the ICP instrument.

The sample etched for 300 seconds is cleaved and examined by scanning electron microscopy (SEM). Cross-sectional images show that there is some undercutting of the mask. Because the pressure in the chamber was chosen to be less than 5 mTorr to maintain a mean free path length greater than 100 $\mu$m, the undercutting is probably due to a relatively small platen power and purely thermal etching of the Si by F.

EXAMPLE 6

Time to etch through thin oxide layer

Figure 5:
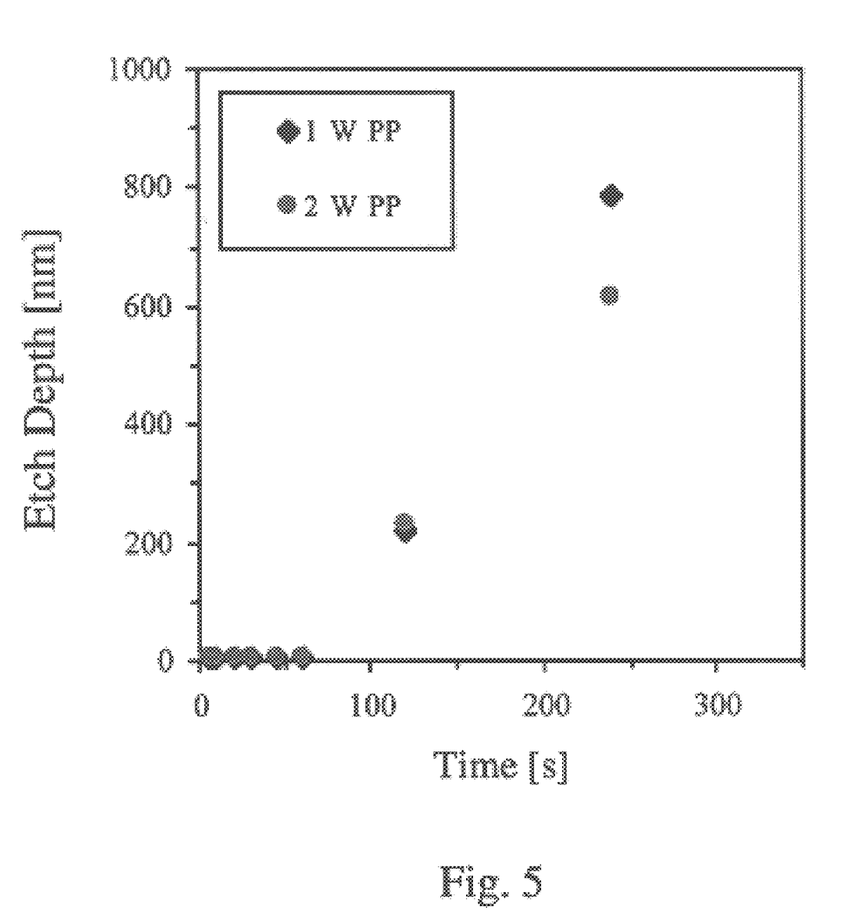
FIG. 5 is a graph of etch depth vs. time for platen powers of 1 W and 2 W.

Even when HF is used to remove oxide layers from Si samples, there is some oxide regrowth during the time that it takes to apply the S-layers to the surface. Therefore, a series of experiments is performed to determine the time needed to etch through this thin oxide layer. Si samples are cleaned in a piranha solution, and 1.2 nm of Cr is deposited through 1000-mesh TEM grids to create an array of Cr squares on the surface. The samples are then etched in 5 sccm $SF_6$ at 4 mTorr, 100 W CP, and 1 W platen power for 5, 10, 15, 20, 30, 45, 60, 120, and 240 seconds. Another set of samples is etched similarly with a platen power of 2 W. Etch depths are measured by AFM. FIG. 5 shows the etch depth as a function of time for both of these series, indicating that it took at least 60 seconds to etch through the oxide layer, after which the Si etched very rapidly.

EXAMPLE 7

Etching experiments with Cr-coated S-layers

S-layers are mounted on a Si(100) substrate, and 1.2 nm of Cr is deposited on the S-layers at 60° from normal incidence. The etch rates of the Cr-coated masks and the substrate are determined at the micron length scale to obtain information about the etch selectivity and to provide upper bounds for estimating the etch rates for subsequent experiments at the nanometer length scale.

It is known from the literature that the etching of $SiO_2$ requires a significant ion bombardment component. Therefore, the etch rate of the substrate beneath the Cr coated S-layers is studied as a function of platen power and etch time. The applied platen power determines the magnitude of the DC bias which accelerates ions toward the sample surface during etching. It takes several minutes to etch through the oxide layer on the Si. Typically, the etch rate of a substrate decreases as the size of the mask aperture decreases. Therefore, the increase in time to etch through the $SiO_2$ is a result of a decrease in the etch rate due to the small apertures of the S-layer mask. During this time, the mask starts to degrade. Because the Si etch rate is so much higher than the oxide layer etch rate, the pattern in the Si is destroyed in a matter of seconds by undercutting when the etching finally penetrates the $SiO_2$ layer.

EXAMPLE 8

Etching of Cr coated bionanomasks applied directly to a Si substrate using $H_2$ and $SF_6$ as etchants In an effort to determine whether the use of hydrogen as an etchant and/or reducing agent could reduce the need for long etch times without degrading the Cr mask, a series of experiments is conducted.

Hydrogen reacts with $SiO_2$ according to the following reactions:

$8 H_{(g)} + SiO_{2(s)} \rightarrow SiH_{4(g)} + H_2O_{(g)}$  $\Delta G_f(298 \text{ K}) = -226 \text{ kcal/mol}$
$4 H_{(g)} + SiO_{2(s)} \rightarrow Si_{(s)} + 2 H_2O_{(g)}$  $\Delta G_f(298 \text{ K}) = -100 \text{ kcal/mol}$ where $\Delta G_f(298 \text{ K})$ is the Gibbs free energy of formation for the reaction written at 298 K. Both of these reactions are thermodynamically favorable. Further, the addition of $H_2$ to $SF_6$ reduces the etch rate of Si because the hydrogen scavenges some of the fluorine.

To test the use of $H_2$, Si samples are cleaned in a piranha solution, and 1.2 nm of Cr is deposited through 1000-mesh TEM grids to create an array of Cr squares on the surface. The first sample is etched with 10 sccm $SF_6$ and 4 mTorr, 100 W CP, and 1 W platen power for 60 seconds. The etch depth is measured by AFM to be 115 nm.

A second sample is etched in identical conditions, except that $H_2$ is used instead of $SF_6$. The etch depth is measured by AFM, with the Cr mask in place, to be 6 nM, indicating that $H_2$ does not etch the Si significantly at these conditions.

A third sample is then etched with a two step process. First, the sample is etched using $H_2$ as described above, and then the sample is etched using $SF_6$ as described above without breaking vacuum. The etch depth is measured by AFM to be 240 nm, indicating that the $H_2$ etches or reduces the oxide, which in turn eliminates the induction period required by the $SF_6$ to etch through the oxide.

A fourth sample is etched in 10 sccm of 30% $H_2$/70% by volume $SF_6$ at 4 mTorr, 100 W CP, and 1 W platen power for 60 sec. The etch depth is measured by AFM to be 20 nm, indicating that the addition of $H_2$ to $SF_6$ reduces the etch rate for Si. The etch rate of $SiO_2$ is unaffected by the addition of $H_2$.

Additional Cr-coated bionanomask samples are etched using an initial $H_2$ etch followed by a mixture of $H_2$ and $SF_6$. The platen power and etch time are varied. The solutions used to remove the masks appear to destroy evidence of pattern transfer in the oxide. However, trenches formed at the periphery of the bionanomask patches due to the shadow produced at the trailing edge of each patch in the direction of the initial oblique metal deposition, indicating that etching has occurred.

EXAMPLE 9

Application of a nitrocellulose intermediate transfer layer to a Si (100) substrate An ultrathin (<10 nm) nitrocellulose intermediate transfer layer is formed on each of several Si (100) substrates by applying a 0.5% by weight solution of nitrocellulose in a carrier of amyl acetate to a Si substrate spinning at 5 krpm for 60 seconds. Following this application, the nitrocellulose is cured in air for 30 minutes at 80° C. to remove the amyl acetate carrier.

EXAMPLE 10

Etched holes in a Si(100) substrate

S-layers are applied to the nitrocellulose intermediate transfer layer as shown in FIG. 1(a) and obliquely shadowed with 1.2 nm of chromium at 60° from normal incidence. The sample is etched with 50 sccm of 10%$SF_6$/90%$H_2$ by volume at a pressure of 5 mTorr, 200 W coil power, and 10 W platen power for 30 seconds, illustrated schematically in FIG. 1(b). After etching, the sample is soaked in acetone and swabbed for a few seconds to remove the coated S-layers and the intermediate transfer layer. The result, shown schematically in FIG. 1(c), is a bare silicon surface with a nanopattern of etched holes approximately 5 nm in diameter and having a hexagonal symmetry with a lattice constant of 20 nm, indicating that the mask pattern was transferred into the nitrocellulose using ICP to remove the nitrocellulose beneath the bionanomask pores.

Figure 6:
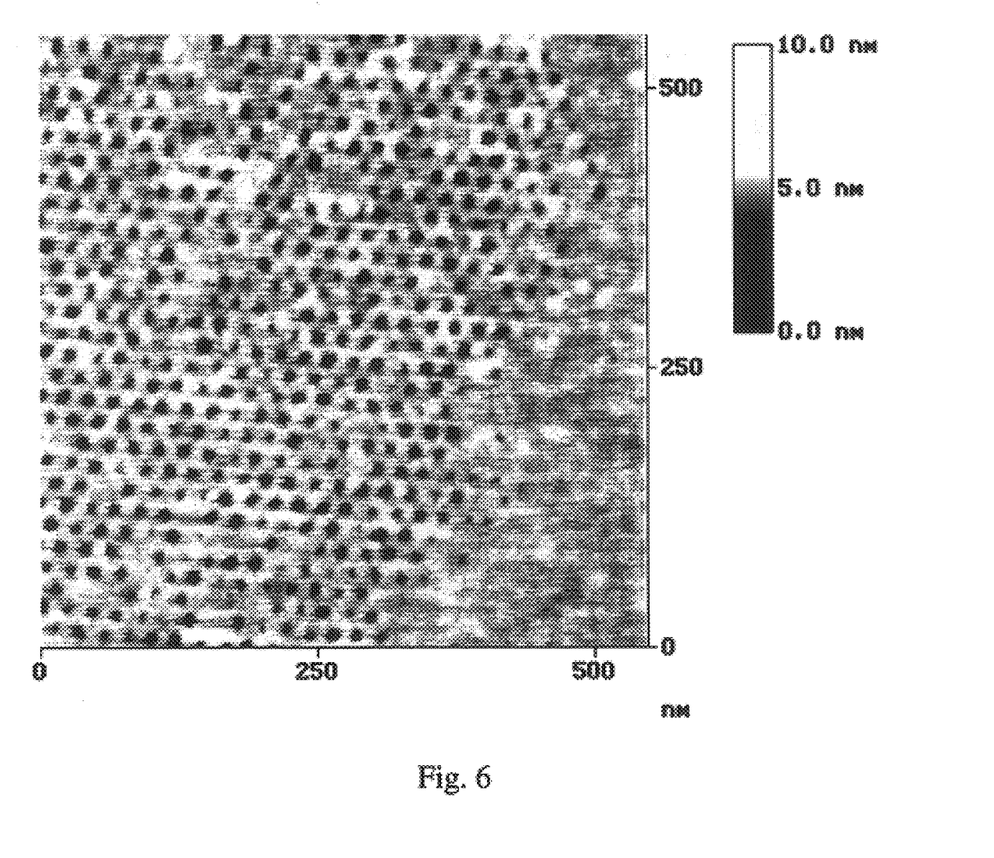
FIG. 6 is an atomic force microscope image showing etched holes in a Si(100) substrate.

FIG. 6 is an atomic force microscope (AFM) image of an array of holes etched into a Si surface using the intermediate transfer layer. The brightness in the image is an inverse function of depth, with the dark areas indicating holes in the brighter surface.

EXAMPLE 11

Inverse pattern transfer of Ti to a Si(100) substrate

In the second successful experiment using the nitrocellulose intermediate transfer layer, as depicted schematically in FIGS. 2(a)–(c), nanomasking and chromium metallization steps are performed as described in Examples 9 and 10, except that the pattern transfer step using $H_2$ ICP etching is employed only long enough to achieve nascent etch pit formation on the silicon substrate. At this point, 1.2 nm of Ti is deposited at normal incidence, as shown schematically in FIG. 2(b), and the mask is subsequently removed. The result is an ordered array of Ti metal nanodots on the silicon surface with dot diameter of about 5 nm, shown schematically as 36 in FIGS. 2(b) and (c). The dot array has hexagonal symmetry with a 20 nm lattice constant. Thus, the inverse nanomask pattern has been reproduced, in metal, on the Si surface.

Figure 7:
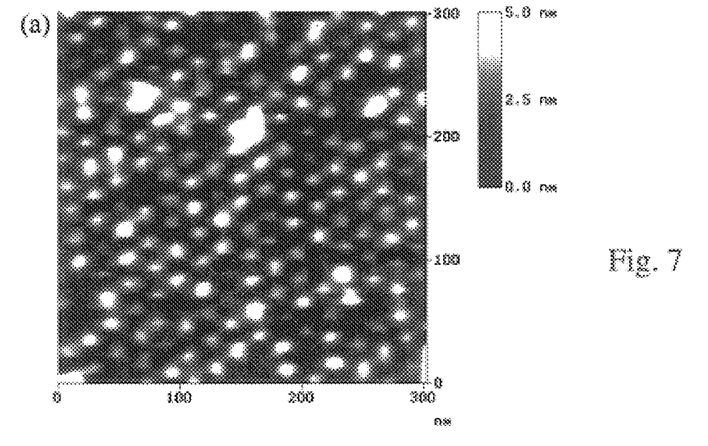
FIG. 7 is an atomic force microscope image showing a pattern of titanium dots transferred to a Si(100) substrate.

FIG. 7 is an atomic force microscope (AFM) image of an array of Ti nanodots on a Si surface created using the intermediate transfer layer. The raised dots appear as bright spots on the darker substrate surface.

EXAMPLE 12

Inverse pattern transfer of Pd to a Si(100) substrate

Figure 8:
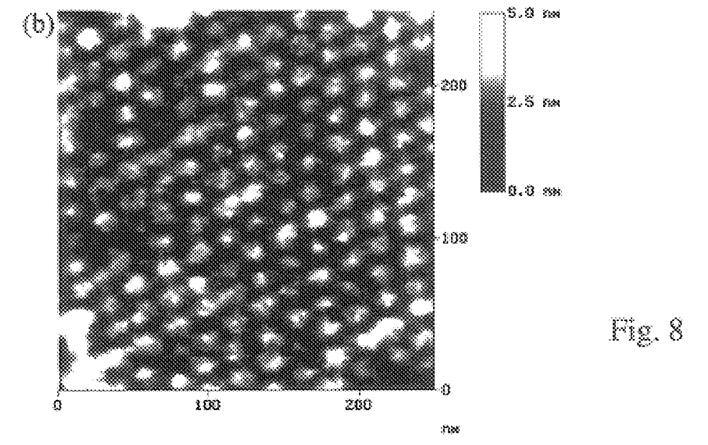
FIG. 8 is an atomic force microscope image showing a pattern of palladium dots transferred to a Si(100) substrate.

Steps are performed as described in Example 11, except that Pd is deposited instead of Ti. The result is an ordered array of Pd metal nanodots on the silicon surface with dot diameter of about 5 nm. The dot array has hexagonal symmetry with a 20 nm lattice constant. FIG. 8 is an atomic force microscope (AFM) image of an array of Pd nanodots on a Si surface created using the intermediate transfer layer. The raised dots appear as bright spots on the darker substrate surface. Thus, the inverse nanomask pattern has been reproduced, in Pd, on the Si surface.

EXAMPLE 13

Inverse pattern transfer of Au to a Si(100) substrate

Figure 9:
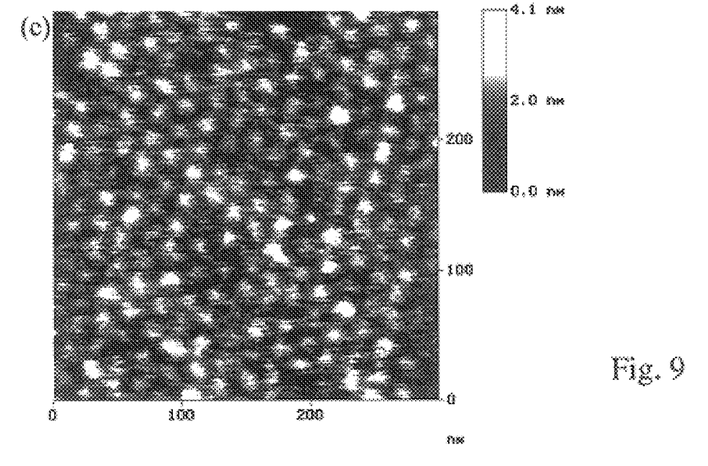
FIG. 9 is an atomic force microscope image showing a pattern of gold dots transferred to a Si(100) substrate.

Steps are performed as described in Example 11, except that Au is deposited instead of Ti. The result is an ordered array of Au metal nanodots on the silicon surface with dot diameter of about 5 nm. The dot array has hexagonal symmetry with a 20 nm lattice constant. FIG. 9 is an atomic force microscope (AFM) image of an array of Au nanodots on a Si surface created using the intermediate transfer layer. The raised dots appear as bright spots on the darker substrate surface. Thus, the inverse nanomask pattern has been reproduced, in Au, on the Si surface.

EXAMPLE 14

Functionalizing an etched substrate surface

A sample is prepared and etched as described in Examples 9 and 11 to expose the silicon substrate surface through the etched holes. Immediately after patterning through the intermediate transfer layer, a 2% solution of trimethoxysilane is made by mixing 100 μL of the silane in 10 mL of reagent grade isopropyl alcohol (5 weight percent water and 95 weight percent alcohol). This modification of the procedure described in Arkles, which is incorporated herein by reference in its entirety, is necessary to prevent degradation of the pattern etched into the nitrocellulose intermediate transfer layer. There is enough water in the isopropyl alcohol solution to hydrolyze the methoxy groups, leaving hydroxyl groups on the organosilane. A small amount of butyl amine is added to help catalyze the hydrolysis. The hydrolysis reaction is shown here:

To insure full hydrolysis of the methoxy groups and oligomerization of the silane, the solution is allowed to incubate for five minutes before addition of the silicon substrates. After hydrolysis, the oligomers hydrogen bond to the silanol groups on the substrates. The substrates are left in the silane solution for approximately twenty minutes and then removed, rinsed with isopropyl alcohol, and blown dry with nitrogen. The substrates are then cured overnight at room temperature. It is necessary to conduct the curing at lower temperatures than taught by Arkles to prevent hardening of the nitrocellulose intermediate transfer layer.

Figure 10:
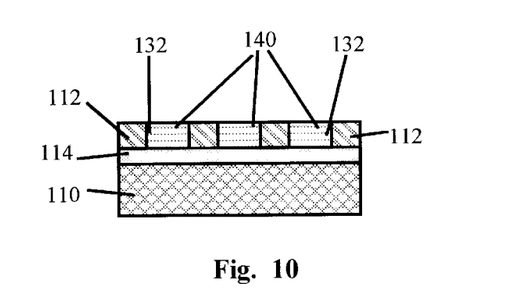
FIG. 10 is a schematic representation of self-assembled monolayer formation on the substrate surface exposed by the pattern formation in the intermediate transfer layer.

The resulting substrate and monolayer pattern are shown schematically in FIG. 10, where a silicon substrate 110 has an SiO$_2$ surface layer 114. Intermediate transfer layer 112 overlies the surface layer 114. Holes 132 have been etched into the intermediate transfer layer 112, and a monolayer 140 has self-assembled on exposed areas of surface layer 114.

EXAMPLE 15

Figure 11:
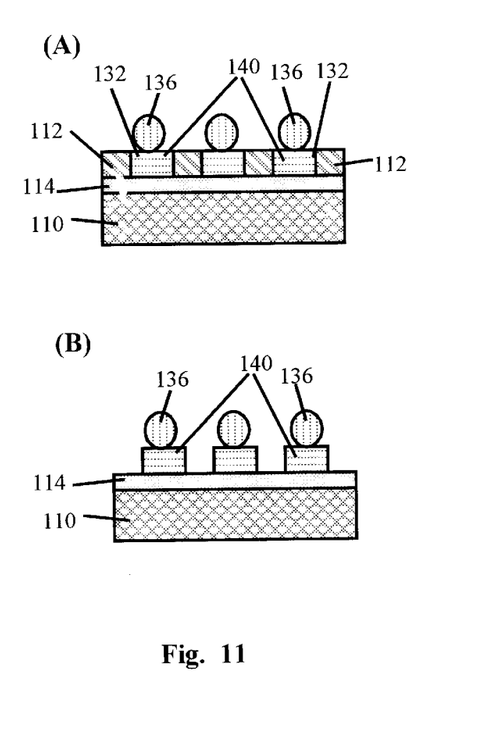
FIG. 11(a) is a schematic representation of selective deposition of adatoms onto the functionalized substrate shown in FIG. 10.
FIG. 11(b) is a schematic representation of the functionalized substrate and deposited adatoms of FIG. 11(a), after removal of the intermediate transfer layer.

Selective deposition of an adsorbate on a functionalized etched substrate surface followed by removal of the intermediate transfer layer A sample is prepared, etched, and functionalized as described in Examples 9, 11, and 12. As illustrated schematically in FIG. 11a, adatoms are deposited on the functionalized substrate surfaces exposed through the intermediate transfer layer, The sample is then immersed in acetone to remove the intermediate transfer layer. The resulting substrate with adsorbate particles adhered to the surface according to the pattern defined by the mask template is shown schematically in FIG. 11b.

EXAMPLE 16

Figure 12:
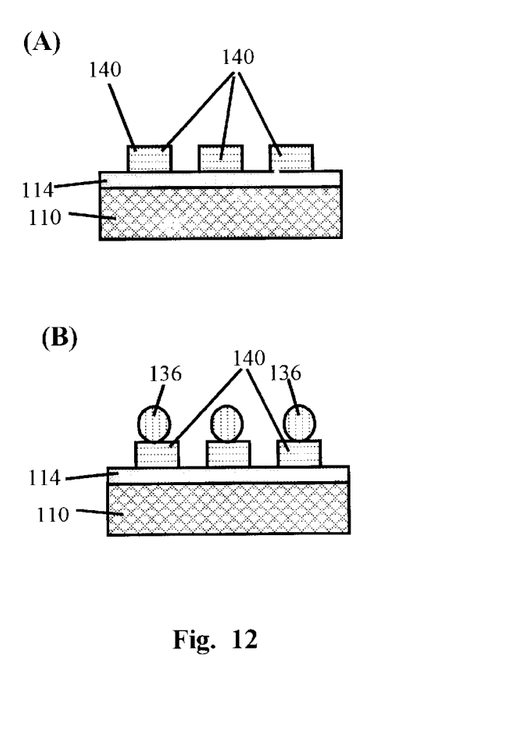
FIG. 12(a) is a schematic representation of the functionalized substrate of FIG. 10 with the intermediate transfer layer removed.
FIG. 12(b) is a schematic representation of the substrate shown in FIG. 12(a) after selective deposition of adatoms onto the functionalized areas of the substrate.

Selective deposition of an adsorbate on a functionalized etched substrate surface after removal of the intermediate transfer layer A sample is prepared, etched, and functionalized as described in Examples 9, 11, and 14. The sample is then immersed in acetone to remove the intermediate transfer layer, leaving a pattern of functionalized areas on the substrate surface corresponding to the pattern of the mask template, indicated schematically in FIG. 12a. Adatoms are then deposited selectively on the functionalized areas of the substrate surfaces exposed through the intermediate transfer layer, as illustrated schematically in FIG. 12a. The resulting substrate with adsorbate particles adhered to the surface according to the pattern defined by the mask template is shown in FIG. 12b.

In summary, we have achieved pattern transfer from a bionanomask to a crystalline Si substrate using inductively coupled plasma etching. This nanopatterning makes use of an intermediate transfer layer of ultrathin nitrocellulose between the masks and the substrate. The intermediate transfer layer is readily amenable to bionanomask pattern transfer and can then itself be used as a mask for pattern transfer to the substrate. The use of an itermediate transfer layer facilitates the direct replication of the inverse pattern of the bionanomask in the form of ordered metal nanodot arrays without the need for adsorbate surface diffusion and nucleation steps.

The preceding discussion refers to the formation of titanium, palladium, and gold nanoclusters on silicon substrates. However, it should be noted that titanium, palladium, gold, and silicon are described as examples of materials that can be used in accordance with the present invention, other materials, such as semiconductors, colloidal particles, or biomolecules, could be deposited on other substrates, using methods known in the art, such as electron beam evaporation, thermal evaporation, molecular beam epitaxy, metal oxide chemical vapor deposition, pulsed laser deposition, and deposition from a colloid. could be used that can be deposited to form nanoclusters that exhibit desired properties, such as quantum confinement.

The foregoing description is considered as illustrative only of the principles of the invention. Further, since numerous modifications and changes will readily occur to those skilled in the art, it is not desired to limit the invention to the exact construction and process shown as described above. Accordingly, all suitable modifications and equivalents may be resorted to falling within the scope of the invention.

References

Arkles, Barry, "Silane Coupling Agent Chemistry," in *Silicon Compounds: Register and Review*, 5$^{th}$ Ed., United Chemical Technologies, Inc., Bristol, Pa., pp. 59–64.

Bhatia, S., Teixeira, J., Anderson, M., Shriver-Lake, L., Calvert, J., Georger, J., Hickman, J., Dulcey, C., Schoen, P., and Ligler, F., "Fabrication of Surfaces Resistant to Protein Adsorption and Application to Two-Dimensional Protein Patterning," *Anal. Biochem.* 208 (1993) 197–205.

Deatherage, J. F., Taylor, K. A., Amos, L. A., "Three-dimensional arrangement of the cell wall protein of *Sulfolobus acidocaldarius,*" *J. Mol. Biol.* 167, (1983) 823–852.

Gerard, J.-M., "Prospects of High-Efficiency Quantum Boxes Obtained by Direct Epitaxial Growth," in *Confined Electrons and Photons,* edited by E. Burstein and C. Weisbuch, Plenum Press, New York, (1995), pp. 357–381.

Grogan, D. W., "Phenotypic Characterization of the Archaebacterial Genus *Sulfolobus:* Comparison of Five Wild-Type Strains," *J. Bacteriol.* 171, (1989) 6710–6719.

Grundmann, M. et. al., P. S. Kop'ef. Zh. I. Alfekov, *Phys. Rev. Let.* 74 (1995) 4043–4046.

Harrison, C. et al., "Lithography with a mask of block copolymer microstructures," *Journal of Vacuum Science and Technology B,* 16, (1998) 544–552.

Heath, J. R. et al., *J. Phys. Chem.* 100 (1996) 3144–3149.

Heath, J. R., C. M. Knobler, D. V. Leff, *J. Phys. Chem. B* 1 (1997) 189–197.

Heinrichdorff, F., M. H. Mao, N. Kirstaedter, A. Krost, and D. M. Bimberg, *Appl. Phys. Lett.* 71 (1997) 22–24.

Huffaker, D. L., G. Park, Z. Zou, O. B. Shchekin, and D. G. Deppe, *Appl. Phys. Lett.* 73 (1998) 2564–2566.

J. C. Hulteen, R. P. Van Duyne, *J. Vac. Sci. Technol A* 13 (1995) 1553–1558.

Jackman, R. J., J. L. Wilbur, G. M. Whitesides, *Science* 269 (1995) 664–666.

Kamins, T. I., D. A. A. Ohlberg, R. S. Williams, W. Zhang, and S. Y. Chou, *Appl. Phys. Lett.* 74 (1999) 1773–1775.

Kim, E., A. Kumar, G. M. Whitesides, *J. Electrochem. Soc.* 142 (1995) 628.

Kirstaedter, N. et al., *Appl. Phys. Lett.* 69 (1996) 1226–1228.

Kumar, A. and Whitesides, G., "Features of gold having micrometer to centimeter dimensions can be formed through a combination of stamping with an elastomeric stamp and an alkanethiol "ink" followed by chemical etching," *Appl. Phys. Lett.* 63 (1993) 2002–2004.

Kumar, A., Biebuyck, H., and Whitesides, G., "Patterning Self-Assembled Monolayers: Applications in Materials Science," *Langmuir* 10 (1994) 1498–1511.

Lembcke, G., Durr, R., Hegerl, R., and Baumeister, W., "Image analysis and processing of an imperfect two-dimensional crystal: the surface layer of the archaebacterium *Sulfolobus acidocaldarius* reinvestigated," *J. Microsc.* 161 (1991) 263–278.

Lercel, M., Craighead, H, Parikh, A., Seshadri, K., and Allara, D., "Sub-10 nm lithography with self-assembled monolayers," *Appl. Phys. Lett.* 68 (1996) 1504–1506.

Li, R. R., P. D. Dapkus, M. E. Thompson, W. G. Jeong, C. Harrison, P. M. Chaikin, R. A. Register, and D. H. Adamson, *Appl. Phys. Lett.* 76 (2000) 1689–1691.

Luedtke, W. D. and U. Landman, *J. Phys. Chem.* 100 (1996) 13323–13329.

Michel, H., Neugebauer, D.-Ch., Oesterhelt, D., "The 2-D crystalline cell wall of *Sulfolobus acidocaldarius*: structure, solubilization, and reassembly," in Baumeister, W. and Vogell, W. (Eds.), *Electron Microscopy at Molecular Dimensions,* Springer, N.Y., 1980. Pp. 27–35.

Moore, J. T., P. D. Beale, T. A. Winningham, K. Douglas, *Appl. Phys. Lett.* 71 (1997) 1264–1266.

Murray, C. B., D. J. Norris, M. G., Bawendi, *J. Am. Chem. Soc.* 115 (1993) 8706–8715.

Murray, C. B., C. R. Kagan, M. G., Bawendi, *Science* 270 (1995) 1335–1338.

Ohara, P., D. V. Leff, J. R. Heath, W. M. Gelbart, *Phys. Rev. Let.* 75 (1995) 3466–3469.

Ozin, G. A., "Morphogenesis of Biomineral and Porphosynthesis of Biomimetic Forms,"*Acc. Chem. Res.* 30 (1997) 17–27.

Pearson, D. H. and R. J. Tonucci, "Nanochannel Glass Replica Membranes," *Science,* 270 (1995) 68–70.

Pum, D. and U. B. Sleytr, "Molecular Nanotechnology and Biomimetics with S-Layers," in Sleytr, U. B. et al., *Crystalline Bacterial Cell Surface Proteins,* R. G. Landes and Academic Press, San Diego, Calif., 1996.

Sleytr, U. B. and Messner, P., "Crystalline surface layers on bacteria," *Ann. Rev. Microbiol* 37 (1983) 311–339.

Sleytr, U. B. et al., "Two-Dimensional Protein Crystals (S-Layers): Fundamentals and Application Potential," Mat. Res. Soc. Symp. Proc. 330 (1994) 193–199.

St. John, P. and Craighead, H., "Microcontact printing and pattern transfer using trichlorosilanes on oxide substrates," *Appl. Phys. Lett.* 68 (1996) 1022–1024.

Taylor, K. A., Deatherage, J. F., and Amos, L. A., "Structure of the S-layer of *Sulfolobus acidocaldarius,*" *Nature* 299 (1982) 840–842.

Weiss, R. L., "Subunit cell wall of *Sulfolobus acidocaldarius,*" *J. Bacteriol.* 118 (1974) 275–284.

Whetten, R. L., J. T. Khoury, M. M. Alvarez, S. Murthy, I. Vezmar, Z. L. Wang, P. W. Stephens, C. L. Cleveland, W. D. Luedtke, U. Landman, *Adv. Mater.* 8 (1996) 428–433 and references therein.

Wilbur, J., Kumar, A., Kim, E., and Whitesides, G., "Microfabrication by Microcontact Printing of Self-Assembled Monolayers," *Adv. Mater.* 6 (1994) 600–604.

Winningham, T. A., H. P. Gillis, D. A. Choutov, K. P. Martin, J. T. Moore, and K. Douglas, *Surf Sci.* 406 (1998) 221–228.

Winningham, T. A. et al., U.S. patent application Ser. No. 09/583,209, filed May 30, 2000.

Winningham, T. A. et al., U.S. patent application Ser. No. 09/642,135, filed Aug. 18, 2000.

We claim:

1. A method for producing an ordered array of nanostructures on a substrate surface, comprising the steps of:
   providing a substrate having a surface;
   forming an intermediate transfer layer on said substrate surface;
   mounting a mask template on said intermediate transfer layer, wherein said mask template includes an ordered array of nanoscale pores therein; and
   etching a pattern through said intermediate transfer layer, wherein said pattern substantially replicates the size and spacing of the ordered array of nanoscale holes in said mask template.

2. The method of claim 1, comprising the additional step of applying a coating to said mask template to form a patterning mask.

3. The method of claim 2, wherein said coating comprises a material selected from titanium, chromium, vanadium, tungsten; oxides of titanium, chromium, vanadium, and tungsten; and combinations thereof.

4. The method of claim 1, comprising the additional step of removing said mask template from said intermediate transfer layer.

5. The method of claim 1, wherein said mask template comprises a material selected from inorganic crystalline materials, glass, block copolymers, naturally occurring biological materials, modified biological materials, and biomimetically grown materials.

6. The method of claim 1, wherein said step of forming an intermediate transfer layer comprises spin coating a material onto said substrate.

7. The method of claim 1, wherein said intermediate transfer layer comprises a self-developing resist.

8. The method of claim 7, wherein said resist comprises a material selected from formvar, polyimide, photoresists, PMMA, nitrocellulose, ammonium perchlorate, oxalic acid, and picric acid.

9. The method of claim 1, comprising the additional step of modifying the surface properties of the intermediate transfer layer prior to said mounting step.

10. The method of claim 1, wherein said etching step comprises etching through said intermediate transfer layer and forming an array of wells in said substrate.

11. The method of claim 1, wherein said etching step comprises etching wells through said intermediate transfer layer without etching substantially into said substrate.

12. The method of claim 11, further comprising the step of depositing adatoms through the wells in said intermediate transfer layer onto said substrate surface.

13. The method of claim 11, further comprising the step of modifying said substrate surface where said surface is exposed by said etching step.

14. The method of claim 10, wherein adatoms are deposited into said wells in said substrate.

15. The method of claim 1, wherein said substrate is provided with a surface roughness greater than about 1 nm RMS roughness.

16. The method of claim 1, wherein said etching step comprises dry etching.

17. The method of claim 1, wherein:

said substrate and said mask template have similar etch rates; and said intermediate transfer layer has an etch rate significantly different from the etch rates of said substrate and said mask template.

18. A method for producing an ordered array of nanostructures on a substrate surface, comprising the steps of:

providing a substrate having a surface;

forming an intermediate transfer layer on said substrate;

mounting a mask template on said intermediate transfer layer, wherein said mask template includes an ordered array of nanoscale pores therein;

transferring a first pattern comprising a first ordered array of nanostructures to said intermediate transfer layer, wherein said first ordered array of nanostructures corresponds to said nanoscale pores in said mask template; and transferring a second pattern comprising a second ordered array of nanostructures to said substrate, wherein said nanostructures in said second array correspond to said first ordered array of nanostructures of said intermediate transfer layer.

19. The method of claim 18, wherein said step of transferring said first pattern comprises dry etching.

20. The method of claim 19, wherein said dry etching comprises inductively coupled plasma etching.

21. The method of claim 18, wherein said step of transferring said first pattern is selected from deposition of adatoms onto said intermediate transfer layer, etching of wells into said intermediate transfer layer, and combinations thereof.

22. The method of claim 18, wherein said step of transferring said second pattern comprises a method selected from dry etching, electron beam evaporation, thermal evaporation, molecular beam epitaxy, metal oxide chemical vapor deposition, deposition from a colloid, pulsed laser deposition, and combinations thereof.

* * * * *